United States Patent [19]
Hayasaka et al.

[11] 4,008,107
[45] Feb. 15, 1977

[54] METHOD OF MANUFACTURING SEMICONDUCTOR DEVICES WITH LOCAL OXIDATION OF SILICON SURFACE

[75] Inventors: Akio Hayasaka, Kodaira; Hideo Noda, Oume; Michio Suzuki, Hino; Hiroyuki Kondo, Tokyo, all of Japan

[73] Assignee: Hitachi, Ltd., Japan

[22] Filed: Dec. 19, 1973

[21] Appl. No.: 426,352

[30] Foreign Application Priority Data

Sept. 27, 1973 United Kingdom ............. 45236/73

[52] U.S. Cl. .............................. 148/175; 29/576 R; 29/578; 29/580; 148/187; 357/49; 357/50; 357/86; 357/88

[51] Int. Cl.² .................... H01L 21/76; H01L 27/04

[58] Field of Search ............. 148/175, 187; 357/50, 357/86, 88; 29/576–578, 580

[56] References Cited

UNITED STATES PATENTS

| | | | |
|---|---|---|---|
| 3,427,709 | 2/1969 | Schutze et al. | 29/580 |
| 3,456,169 | 7/1969 | Klein | 148/175 X |
| 3,591,430 | 7/1971 | Schlegel | 148/175 |
| 3,596,149 | 7/1971 | Makimoto | 148/187 X |
| 3,648,125 | 3/1972 | Peltzer | 357/50 |
| 3,659,160 | 4/1972 | Sloan et al. | 148/175 X |
| 3,755,001 | 8/1973 | Kooi et al. | 148/175 X |
| 3,873,383 | 3/1975 | Kooi | 148/187 |

OTHER PUBLICATIONS

Baker et al., "Impact of Isoplanar—Read/Write Memories" IEEE International Electron Devices Mtg., Dec. 3-5, 1973, pp. 1–8.
Appels et al., "Local Oxidation of Silicon; New Technological Aspects" Philips Res. Repts., vol. 26, No. 3, June 1971, pp. 157–165.
Kemlage, B. M., "Prevention of Metal to Base Shorting" IBM Tech. Discl. Bull., vol. 13, No. 5, Oct. 1970, pp. 1299–1300.
Murphy et al., "Simplified Bipolar—Application to Systems" IEEE J. Solid State Circuits, vol. 50–55, No. 1, Feb. 1970, pp. 7–14.
Appels et al., "Local Oxidation of Silicon—Technology" Philips Res. Repts. 25, 118–132, Apr. 1970.
Kooi et al., "Selective Oxidation of Silicon—Device Applications" Semiconductor Silicon/1973, text, Huff et al., eds., May, 1973, pp. 860–879.
Peltzer et al., "Isolation Method—Dense Memories" Electronics, Mar. 1, 1971, pp. 52–55.

*Primary Examiner*—L. Dewayne Rutledge
*Assistant Examiner*—W. G. Saba
*Attorney, Agent, or Firm*—Craig & Antonelli

[57] ABSTRACT

An improved method of manufacturing a semiconductor device employs a local oxidation process in which an oxide isolation region is formed by locally oxidizing a silicon epitaxial layer, using a nitride-oxide double layer for masking purposes, with a P⁺ type region being formed by the diffusion of an impurity into the silicon epitaxial layer using the oxide isolation region, which has an "oxide beak", as a diffusion mask. An additional region of the same conductivity type as the P⁺ type diffused region is provided to be contiguous to the P⁺ type diffused region, so that a PN junction terminates at a silicon surface remote from the electrode to be connected to the P⁺ diffused region.

As a result, disadvantages caused by the oxide beak, such as the imperfect protection of the PN junction and short-circuiting between the electrode and the epitaxial layer through pin holes in the oxide beak can be eliminated.

3 Claims, 16 Drawing Figures

METHOD OF MANUFACTURING SEMICONDUCTOR DEVICES WITH LOCAL OXIDATION OF SILICON SURFACE

BACKGROUND OF THE INVENTION

1. Field of the Invention

The present invention relates to the manufacture of semiconductor devices, such as integrated circuits, transistors and diodes, wherein a local oxidation process is employed to locally oxidize a silicon substrate through the use of a mask made of a nitride-oxide double layer.

2. Description of the Prior Art

In the field of manufacturing bipolar integrated circuits, particularly bipolar memories, improvements have been made toward the increase of the density of the circuit elements to be included in an integrated circuit chip. Among techniques which have been employed is the oxide isolation technique which is suitable and advantageous for manufacturing bipolar integrated circuits which are to have a high speed or frequency of operation. This oxide isolation technique is described in the Peltzer, U.S. Pat. No. 3,648,125, issued Feb. 2, 1971.

In accordance with the oxide isolation technique, semiconductor isolation regions (diffused P-type regions), which isolate circuit elements from each other in conventional bipolar integrated circuits, are replaced by oxide regions which are formed by locally oxidizing portions of the epitaxial layers which are not masked by a silicon nitride layer.

In addition to the technique described in the above referred to patent, there are two variants of such an oxide isolation technique for forming bipolar integrated circuits, which are described in an article by W. D. Baker, et al., entitled "Oxide Isolation Brings High Density to Production Memories" published in Electronics, Mar. 29, 1973, pages 65–70. One of the variants described is the epitaxial-base process in which P-type epitaxial layers are employed as the base regions of bipolar transistors. The other variant is the double-diffused process in which the base regions are formed by impurity diffusion techniques.

Examples of semiconductor devices formed in accordance with such techniques are depicted in FIGS. 4 and 5 of the drawings of the present application which, respectively, illustrate an epitaxial base type oxide isolation integrated circuit and a double-diffused type oxide isolation integrated circuit.

In FIG. 4, upon a P-type substrate 1, in which an N+ region 2 has been diffused, an epitaxial layer 3 is formed. This epitaxial layer has a P-type base region, in which an N+ emitter region 11 is formed. Surrounding the base region and isolating the collector contact region 12, of N+ conductivity, is an oxide isolation region 7, which contains beaks 7a–7d at the edges thereof. Overlapping the emitter-base junction is a protective insulating film 9, and respective emitter, base and collector electrodes 13a–13c contact the respective surface portions of the device through the insulating and oxide layers.

The epitaxial-base process to form such a device has been principally employed to date, since it includes simpler manufacturing steps as compared with the double-diffused process (a decrease in the manufacturing steps reduces the number of design variables) and since the collector-to-emitter leakage current is small.

Although the double-diffused process is superior to the epitaxial-base process with respect to the resulting speed or frequency of operation of the completed device, the double-diffused process, which results in the formation of a device as depicted in FIG. 5, has serious drawbacks.

With reference to FIG. 5, in which like reference numerals to those employed in FIG. 4 are employed, the base region, rather than being epitaxially formed as shown in FIG. 4, is diffused to form a diffused base region 8. In order to avoid the formation of dislocations or defects in the silicon substrate beneath the nitride layer which is used to form the diffused regions, a nitride-oxide double layer film is employed for masking the silicon surfaces during the local oxidation of the silicon substrate. When the local oxidation of the silicon surface is carried out with the nitride-oxide double-layer film, silicon oxide beaks 7a–7d are formed due to the additional supply of oxygen in the lateral direction through the intermediate oxide layer. The formation of such "beaks" is described in an article by J. A. Appels, et al., entitled "Local Oxidation of New Technological Aspects" published in Volume 26, No. 3, of the Phillips' Research Reports, June 1971, pages 157–165.

In the double-diffused process, the oxide region 7, with the beaks, may be used as a diffusion mask forming the base region 8. The base diffusion results in the formation of a PN junction 38 which terminates at the surface of the silicon layer 3b, below the oxide beaks 7a, 7d. Where the impurity diffusion is followed by an etching process, the PN junction 38 may sometimes be left unprotected since the oxide beak is easily etched away. It is especially difficult to avoid leaving the PN junction unprotected when the base contact aperture is formed so as to be self-aligned with the edge of the oxide isolation region.

Furthermore, when the base electrode 13b is formed so as to contact a pair of the diffused base region 8 near the oxide isolation region 7 and extends onto the oxide beak 7a, the base electrode 13b may be short-circuited with the N type epitaxial layer (collector region) 3b, through a pin hole in the oxide beak.

In addition, a leakage channel may be formed at the interface of the base region 8 and the oxide beak 7 due to the small distance between the base electrode 13b and the collector region along the oxide isolation region 7.

SUMMARY OF THE INVENTION

It is, accordingly, an object of the present invention to overcome the above-mentioned deficiencies of the double-diffused type oxide isolation technique for obtaining bipolar integrated circuits which have a higher speed or frequency of operation, by eliminating the above-mentioned problems such as an unprotected PN junction, short-circuiting, and the existence of a leakage channel between the base electrode and the collector region.

The inventors have discovered that these above-mentioned problems are attributable to the fact that the PN junction which is formed between the diffused base region and the collector region terminates at the silicon surface beneath the oxide beak and that the base electrode is positioned in the vicinity of the oxide beak, and have provided an improvement, so that the PN junction of the diffused base terminates at the surface of the silicon substrate which is remote from the base electrode. To overcome such disadvantages of the prior art and to provide that the PN junction of the diffused base terminates at the surface of the silicon substrate remote from the base electrode, an additional region is provided which is contiguous to the diffused base region, so that the PN junction between the diffused base region and the epitaxial layer in which the base region is diffused will necessarily terminate at a silicon surface which is remote from the base electrode.

This additional region may be deformed by the diffusion of an impurity of the same conductivity type as the base region, such as gallium, which impurity is not masked by the oxide region, either before or after the formation of the base region. Alternatively, the additional region may be epitaxially grown on the N-type epitaxial layer and the base region may be diffused through this additional region.

As the result of the additional region, the distance between the end portion of the PN junction and the base electrode will necessarily be increased. Furthermore, the PN junction between the collector and the base will not be unprotected since the PN junction terminates at a thick portion of the isolating oxide region. Moreover, there is no possibility of a short-circuit through a pin hole in the oxide beak, since the beak in which a pin hole might exist is spaced apart from the epitaxial layer by the additional region. In addition, a leakage channel will not be formed since the distance along the interface between the base electrode and the epitaxial layer is increased.

DESCRIPTION OF THE PREFERRED EMBODIMENTS

Embodiment I

Figure 1A:
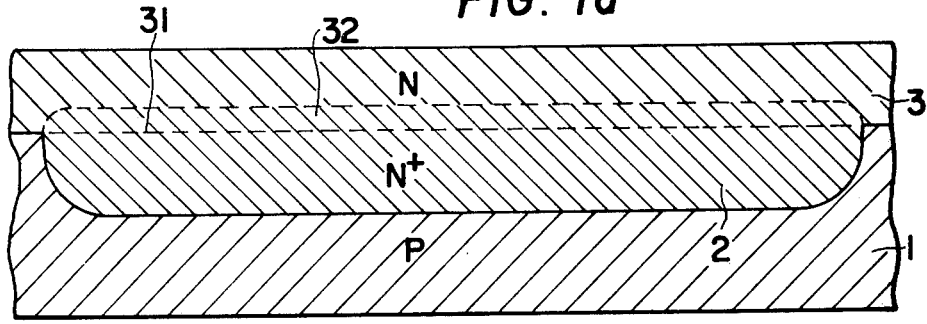
FIGS. 1a – 1f illustrate, in cross-sectional form, a semiconductor device, at sequential steps of manufacture, made in accordance with a first embodiment of the present invention.

Referring now to FIGS. 1a–1f of the drawings, upon a P-type silicon substrate 1, in which an N$^+$ type varied layer 2 is provided, a silicon layer 3 is epitaxially grown. In the growth process, the silicon layer 3 may be grown by hydrogen reduction of $SiCl_4$ (the mol ratio of $SiCl_4$ being 0.01) including 10 ppm of $PH_3$ ( flow rate 40cc/min.) as a dopant at a temperature 1150° C for 200 seconds. The resulting epitaxial layer 3 has a resistivity of about 0.18Ωcm and, during the growth process, across the metalurgical interface 31 between the substrate 1 and the layer 3, an out-diffusion from the N$^+$ region 2 into the epitaxial layer 3 takes place, thereby forming outdiffused region 32. As examples of typical parameters, the depth of the diffused region 2 may be about two microns, the epitaxial layer may also be about two microns in thickness, while the out-diffused region 32 will have a thickness of about 0.5 microns.

Subsequent to the epitaxial growth of the silicon layers 3, a silicon dioxide film 4 is formed upon epitaxial layer 3 by oxidizing the surface of the silicon layer 3 in a dry oxygen atmosphere at 1000° C for 30 minutes. Upon this deposited silicon dioxide film, a silicon nitride film 5 is deposited by the reaction of a mixed gas, with a flow rate of 300 cc/min., of $SiH_4$ diluted by nitrogen ( $SiH_4$ :4% ) and $NH_3$ at a flow rate of 360 cc/min. at a temperature of 800° C for 4 minutes. The resulting thickness of the silicon dioxide film is about 500 A and that of the silicon nitride film is about 1500 A. Then, as shown in FIG. 1b, the double layer of silicon dioxide and silicon nitride is selectivity etched to form masks 6a and 6b. The double layer of silicon dioxide and silicon nitride is selectively etched by covering selective portions with photoresistive layers, and first etching portions of the silicon nitride film 5 not covered with the resistive layers in hot phosphoric acid at 170° C for 13 minutes, and then etching portions of the silicon dioxide film 4 which are not covered with the silicon nitride film 5 in an etchant of one part of HF and 7 parts of $NH_4F$ at room temperature for 60 seconds. Then, the silicon epitaxial layer 3 is selectively etched through the use of masks 6a and 6b by an etchant of one part of HF and 500 parts of $HNO_3$ at room temperature for 120 minutes, to form silicon islands 3a and 3b, surrounded by etched out portions 3c. In one example, the depth of the etched out portions may be about one micron.

Figure 1B:
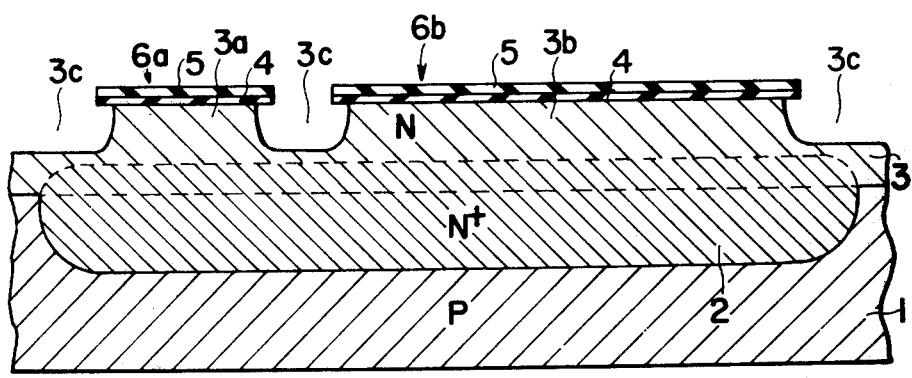
Figure 1C:
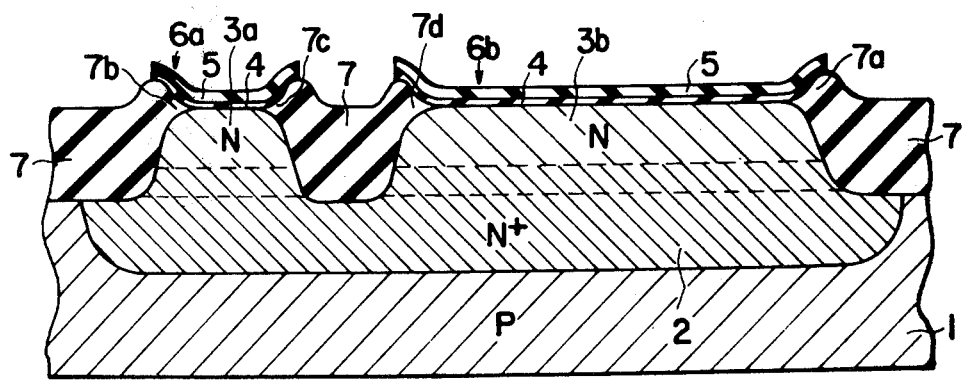

Next, as shown in FIG. 1c, the epitaxial layer 3 is locally oxidized in wet $O_2$, which is obtained by passing 2l/min. of $O_2$ through water maintained at a temperature of 95° C in a bubbler, at a temperature of 1000° C for 18 hours to form an isolating oxide region 7, which reaches the surface of the substrate 1 and completely surrounds the islands 3a and 3b. The oxide isolation region 7 has beaks 7a–7d adjacent mount portions which push up the double layer masks 6a and 6b formed of the double layer of silicon dioxide and silicon nitride.

Figure 1D:
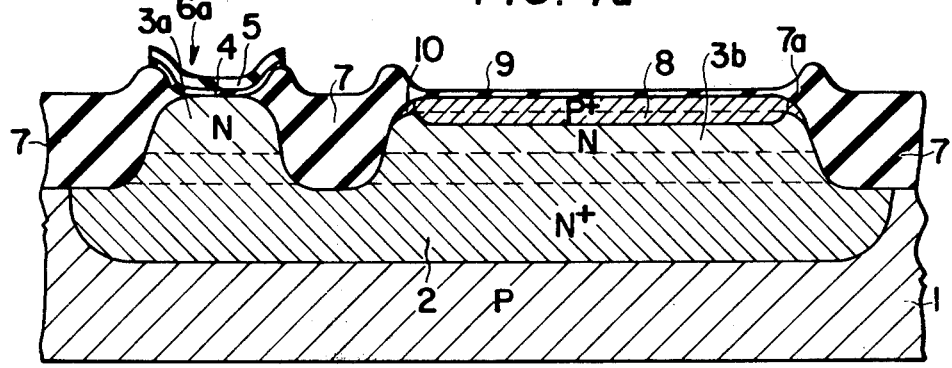

Next, mask 6b is removed by etching silicon nitride in a hot phosphoric acid at a temperature of 170° C for 15 minutes, and then etching silicon dioxide in an etchant of one part of HF and 7 parts of $HN_4F$ at room temperature for 90 seconds. Then, boron is diffused into the island portion 3b by depositing boron from boron oxide at a temperature of 875° C for 200 minutes; then, after removing the boron oxide deposited on the semiconductor surface, re-diffusing the deposited boron deeply into silicon at a temperature of 1100° C for 30 minutes in a wet $O_2$ which is obtained by passing 2l/min. of $O_2$ through water at 90° C in a bubbler to form base region 8 as shown in FIG. 1d. During the formation of the base region 8, a silicon oxide film 9 is formed on the surface thereof. The depth to which the base region may extend is about 0.5 microns.

Then, an impurity of the same conductivity type as that of the base region 8 is diffused through the silicon dioxide film 9 and the oxide region 7 above the island portion 3b to form an additional P-type region 10. For this purpose, gallium may be employed, since it is not masked by the silicon oxide but is masked by the silicon nitride, by diffusing gallium in a vacuum-closed enclosure at a temperature 1050° C for 3 hours. As a result, the additional region 10 extends beneath the edges of the beak portions 7a and 7d at island portion 3b of the epitaxial layer 3. The surface resistance $\rho_s$ of the region 8 is about 150 $\Omega/\square$ and its resistivity $\rho$ is about 0.01 $\Omega$ cm. $\rho_2$ for the region 10 is about 1K $\Omega/\square$ while the resistivity of the region 10 is about 0.5 $\Omega$ cm. The depth to which the P- region 10 may extend into the island portion 3b is on the order of 0.3 to 0.45 microns.

Figure 1E:
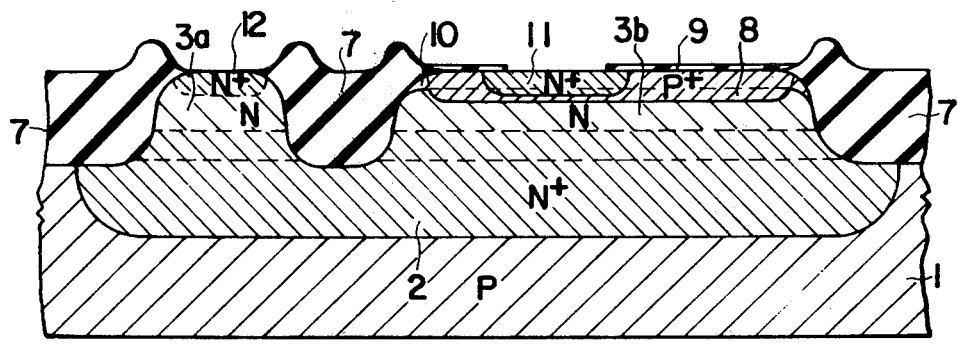

Then, as shown in FIG. 1e, the mask 6a and a portion of the silicon dioxide film 9 are removed by etching silicon in a hot phosphoric acid at a temperature of 170° C for 15 minutes. Silicon oxide is etched in an etchant of one part of HF and 7 parts of NH$_4$ for 90 seconds. During the etching process, the portions to be retained are covered with photo-resistive material. Phosphorous is diffused through the resulting openings by flowing 0.25 l/min. of N$_2$ including POC l$_3$ with a carrier gas of N$_2$ at flow rate of 2 l/min and O$_2$ at a flow rate of 0.3 l/min. at a temperature of 875° C for 40 minutes to form N$^+$ regions 11 and 12, the former region extending to a depth of about 0.4 microns in the base region 8, as an emitter region, while region 12 is for the purpose of the collector electrode contact to be subsequently provided.

Figure 1F:
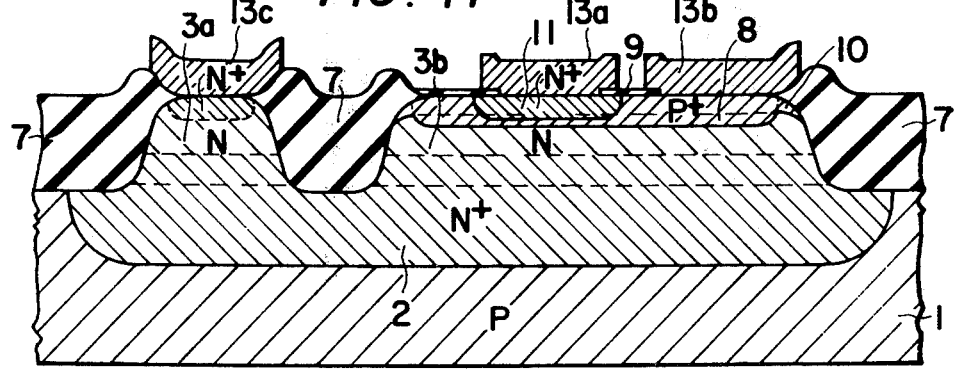

Then, a further opening is provided in the silicon dioxide layer 9 adjacent the oxide beak portion 7a and spaced apart from the emitter region 11 by etching silicon dioxide in an etchant of one part of HF and 7 parts of HN$_4$F for 4 minutes. Through this opening, and the other openings in the outside layers above the regions 11 and 12, electrodes, to provide the emitter, base and collector contacts, are formed by depositing a metal, such as aluminum onto the surface of the resulting regions, as illustrated in FIG. 1f.

As a result of the above process, in which the additional region 10 is provided to be contiguous to the diffused base region 8, the PN collector-base junction between the diffused region 8 and the epitaxial layer portion 3b will terminate at the surface of the silicon layer remote from the base electrode 13b. Namely, the additional region 10 provides additional side portions 10a, as illustrated in FIGS. 1d–1f, so that the PN junction terminates well beneath the portion of the isolated oxide region 7. This means that the PN collector-base junction will be protected by the oxide region 7 and leakage current between the electrode and the epitaxial layer is prevented. Furthermore, there is no possibility of the existence of a short-circuit between the base electrode and the epitaxial layer 3b through a pin hole in the oxide beak, because of the provision of the additional side portion 10a provided by additional region 10.

Embodiment II

In a second embodiment of the invention, instead of diffusing an impurity such as gallium, to form the additional region 10, as was the case in Embodiment I, a P-type epitaxial layer may be initially provided on the semiconductor device structure as illustrated in FIG. 1a.

Figure 2A:
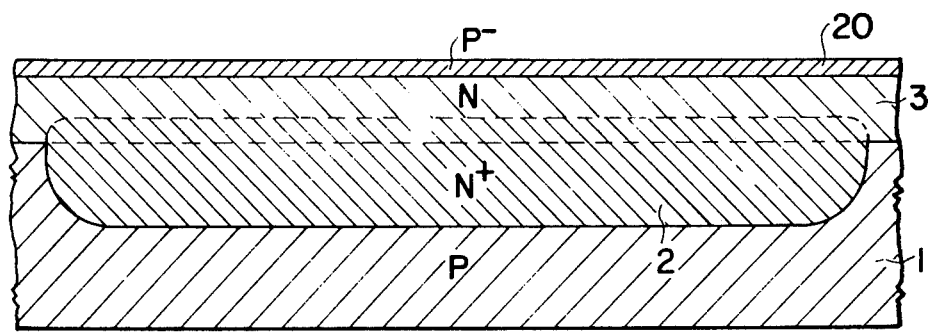
FIGS. 2a and 2b illustrate a second embodiment of the present invention wherein an epitaxial layer is first formed prior to the remainder of the steps to be carried out.

Namely, as shown in FIG. 2a, upon the initially grown epitaxial silicon layer 3, a P- type epitaxial layer 20 is grown to a thickness of about 0.3 microns, which should be shallower than the depth of the emitter region 11, to be subsequently formed, by hydrogen reduction of SiCl$_4$ ( the mol ratio of SiCl$_4$ being 0.01 ) including 15 ppm of B$_2$H$_6$ ( flow rate 30 cc/min. ) as a dopant at a temperature of 1150° C for 100 seconds. Region 20 may be formed by diffusion or ion implantation of a P type impurity into the N type silicon layer 3.

Then, the surface of epitaxial layer 20 is masked, etched and local oxidation takes place as described previously in connection with FIGS. 1b and 1c. Moreover, the same steps illustrated in FIGS. 1d through 1f and described above in connection with Embodiment I are carried out except for the diffusion of gallium, since the epitaxial layer 20 provides the additional regions 20a, to enable the base-collector PN junction to terminate well beneath the beak portion of the isolating oxide region 7. Note that in this embodiment, when forming the base region 8, boron is diffused deeper than the thickness of the epitaxial layer 20 and deeper than the intended thickness of the emitter region 11 to contact the epitaxial layer 3b. As a result, when the emitter region 11 and the collector contact region 12 are subsequently formed, the collector contact region 12 will extend through the epitaxial layer 20 to contact the layer 3a.

Figure 2B:
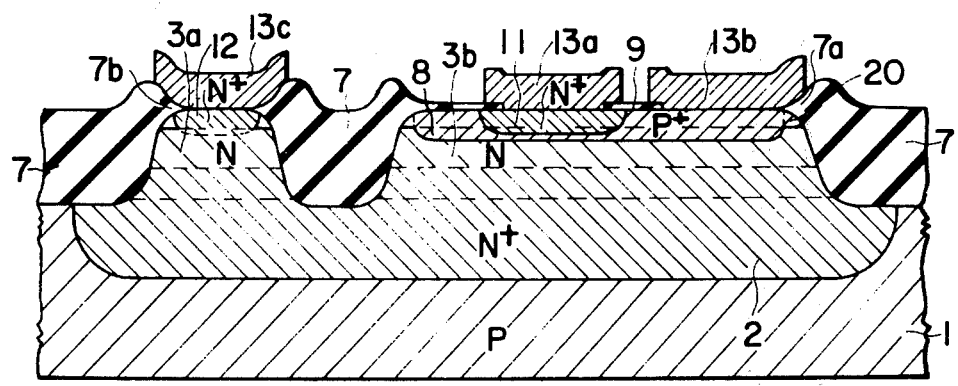

As can be seen from FIG. 2b, the same advantages provided by the structure of FIG. 1f are afforded.

Embodiment III

Figure 3A:
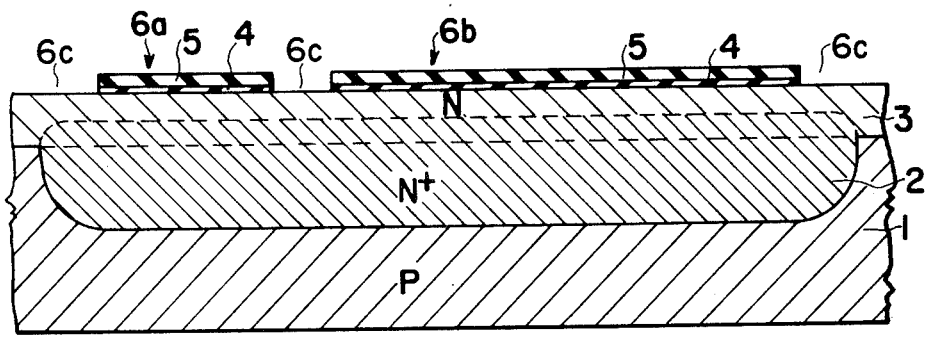
FIGS. 3a–3f illustrate, in cross-sectional form, a semiconductor device manufactured in accordance with a third embodiment of the present invention at the respective sequential steps of manufacture.
Figure 3B:
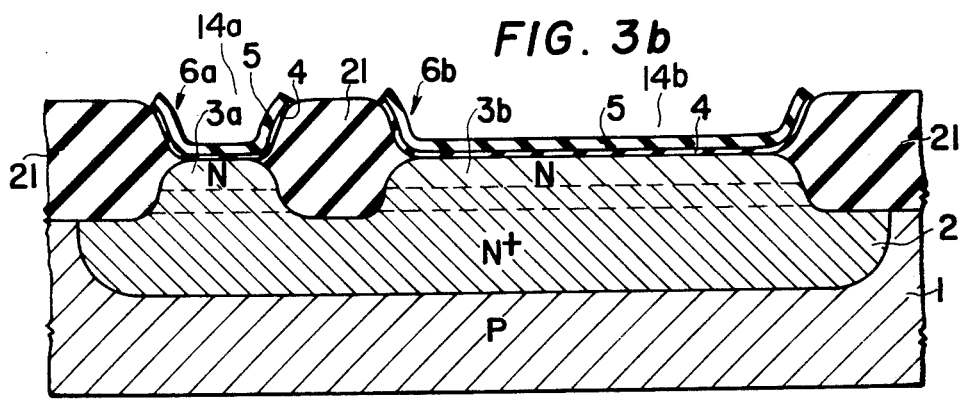

With attention directed to FIGS. 3a through 3f of the drawings, a third embodiment of the present invention will be explained. As is shown in FIG. 3a, a dual mask layer of silicon dioxide and silicon nitride having apertures 6c to form marks 6a and 6b is provided in the same manner as discussed previously in connection with FIGS. 1a and 1b of Embodiment I. However, unlike Embodiment I, the epitaxial layer 3 is not selectively etched through the apertures 6c. Instead, by way of the exposed portions 6c through the masks 6a and 6b, the epitaxial layer 3 is oxidized in wet O$_2$, which is obtained by passing 2l/min. of O$_2$ through water maintained at a temperature of 95° C in a bubbler, at a temperature of 1000° C for 18 hours to form an oxide region 21 which extends down to the substrate 1 and extends upwardly from the interface between silicon dioxide layer 4 and the epitaxial layer 3. As the epitaxial layer 3 is oxidized, the oxide region 12 grows in both the horizontal and vertical directions, pushing up the masking layers 6a and 6b to form trough portions 14a and 14b.

Figure 3C:
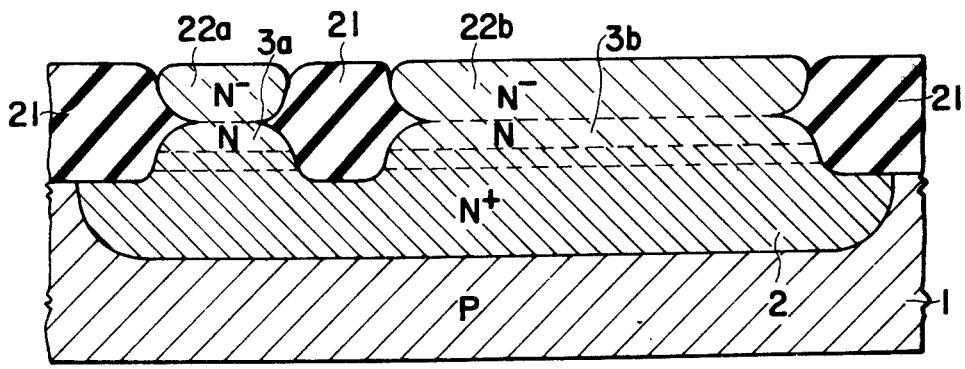

Then, as shown in FIG. 3c, masks 6a and 6b are removed. Namely, the double layer of silicon dioxide and silicon nitride is selectively etched by covering selective portions with photo-resistive layers, and first etching portions of the silicon nitride film 5 not covered with the resistive layers in hot phosphoric acid at 170° C for 13 minutes, and then etching portions of the silicon dioxide film 4 in an etchant of one part of HF and 7 parts of NH$_4$F at room temperature for 60 seconds. Thereafter, as shown in FIG. 3c, N-silicon regions 22a and 22b are selectively grown in the trough portions 14a and 14b upon the islands 3a and 3b, respectively, by hydrogen reduction of SiCl$_4$ ( the mol ratio of SiCl$_4$ being 0.01 ) including 10 ppm of PH$_3$( flow rate 5cc/min. ) as a dopant at a temperature 1150° C for a period of 100 seconds, so that the surfaces of the regions 22a and 22b reach essentially the same level as the surfaces of the oxide region 21.

Then, a layer of silicon dioxide 23 is deposited on the entire surface of the wafer, including regions 21 and 22. To this end, silicon oxide is deposited on the substrate heated at 400° C from a gas of nitrogen diluted SiH$_4$ ( 4% of SiH$_4$ ), ( flow rate 700 cc/min. ), with a flow of 10l/min. of N$_2$ and 0.3 l/min. of O$_2$ for 2 min. to form film portion 23. It is also possible to oxidize regions 22a and 22b to form an oxide coating thereon, rather than deposit silicon dioxide on the entire surface of the wafer.

Figure 3D:
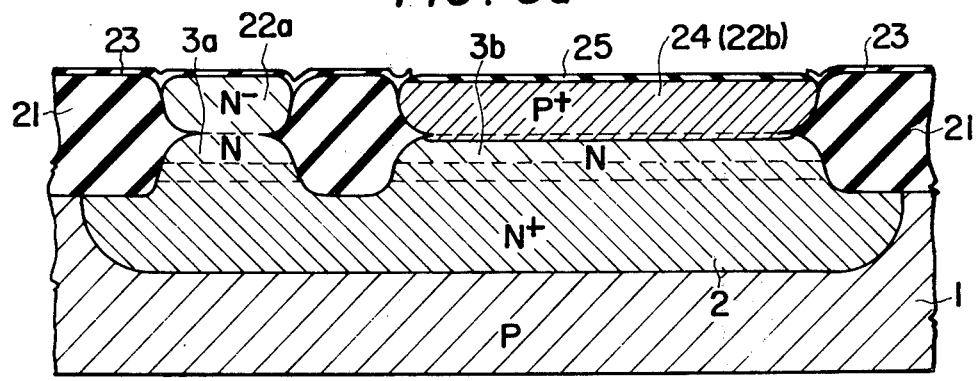

Then, a portion of the silicon dioxide film 23 is etched by etching silicon dioxide in an etchant of one part of HF and 7 parts of $HN_4F$ for 4 minutes to expose the portion of the surface of the region 22b while the oxide film 23 is retained on the region 22a. Through this exposed surface portion, boron is diffused by depositing boron from boron oxide at a temperature of 875° C for 200 minutes; then, after removing the boron oxide deposited on the semiconductor surface, re-diffusing the deposited boron deeply into silicon at a temperature of 875° C for 30 minutes in a wet $O_2$ which is obtained by passing 2l/min. of $O_2$ through water at 90° C in a bubbler to form a P-type base region 24 as depicted in FIG. 3d and during the diffusion treatment, an oxide film 25 is formed on the surface of region 24.

Figure 3E:
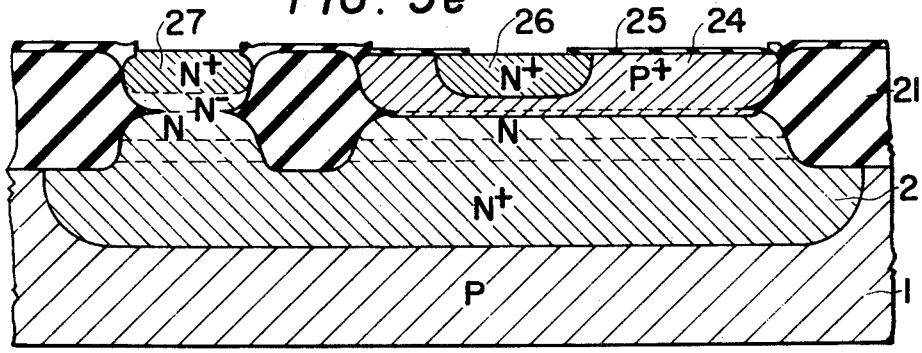
Figure 3F:
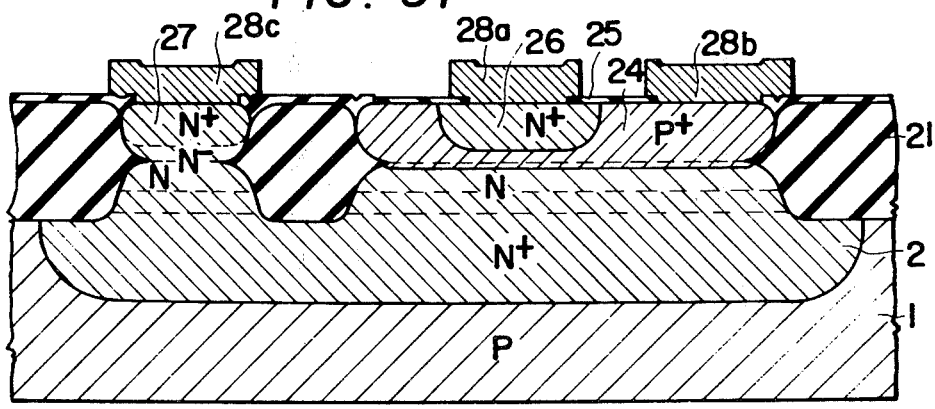
Figure 4:
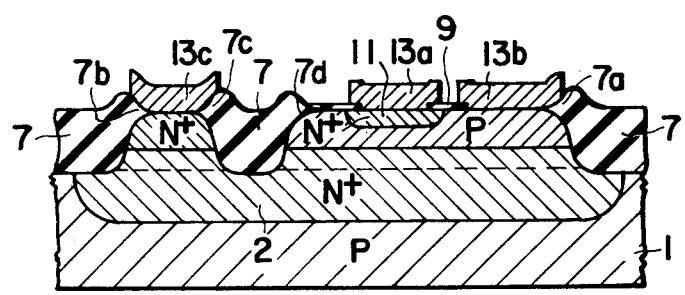
FIGS. 4 and 5 depict devices resulting from methods of manufacture of semiconductor devices according to the prior art.
Figure 5:
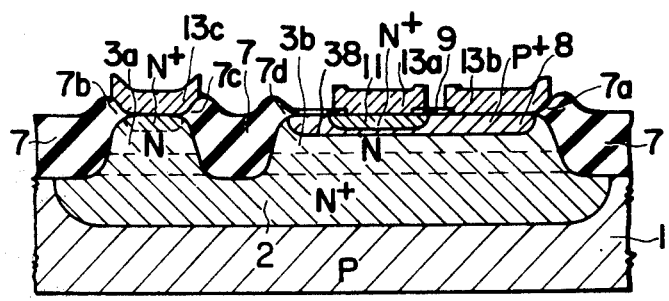

Next, as illustrated in FIG. 3e, selected portions of film 23 disposed on the region 22a and film 25 are etched by etching silicon dioxide in an etchant of one part of HF and 7 parts of $HN_4F$ for 4 minutes and phosphorus is diffused therethrough by flowing 0.25 /min. of $N_2$ including $POC_3$ with a carrier gas of $N_2$ at flow rate of 2l/min. and $O_2$ at a flow rate of 0.3l/min. at a temperature 875° C for 40 minutes to form $N^+$ type regions 26 and 27. Region 26 corresponds to the emitter region within the base region 24, while region 27 is for the purpose of providing a collector contact to the collector region.

Then, the portion of the oxide film 22 adjacent to the film 23 on top of the isolating oxide 21 is removed and metal contacts 28a, 28b and 28c, corresponding to the emitter, base and collector electrodes, are formed by depositing aluminum as described above in connection with FIG. 1f.

According to this embodiment, because of the substantially flat upper surfaces of the oxide 21 and regions 22a and 22b, the surface of the wafer is extremely flat, as the beaks 7a – 7d, as shown in FIG. 1c, do not exist.

This is advantageous to prevent disconnection of the aluminum layers on the protrusions or for providing minute mask alignment.

Of course, as in the case with Embodiments I and II, since the PN junction defined by the $P^+$ type region 24 and the collector region terminates at the silicon surface well below the surface of the silicon where the base electrode is disposed, the objects of the present invention are attained.

Of course, in place of the silicon nitride, which has been referred to as the material employed for masking against the local oxidation of the silicon surface, any material which is impermeable to oxygen, such as molybdenum, may be employed.

While we have shown and described several embodiments in accordance with the present invention, it is understood that the same is not limited thereto, but is susceptible of numerous changes and modifications as known to a person skilled in the art, and we therefore do not wish to be limited to the details shown and described herein but intend to cover all such changes and modifications as are obvious to one of ordinary skill in the art.

What we claim is:

1. A method for manufacturing a semiconductor device comprising the succeeding steps of:
   a. providing a semiconductor substrate of a first conductivity type, said semiconductor substrate having a semiconductor region of a second conductivity type opposite said first conductivity type formed at the surface thereof;
   b. forming a first semiconductor layer of said second conductivity type on said semiconductor substrate so as to bury said semiconductor region thereunder;
   c. forming a second semiconductor layer of said first conductivity type and having a relatively low impurity concentration over the entire surface of said first semiconductor layer whereby a first PN junction between said first and second layers is formed;
   d. selectively forming a mask material which is impermeable to oxygen on at least one predetermined portion of said second semiconductor layer
   e. selectively oxidizing said first and second semiconductor layers except for said at least one predetermined portion so that an oxide region having an oxide beak extending between the edge of said mask material and the portion of said second semiconductor layer thereunder is formed, whereby said first PN junction terminates at the side surface of said oxide region;
   f. removing said mask material thereby exposing the surface of said at least one predetermined portion of said second semiconductor layer;
   g. diffusing an impurity of said first conductivity type through said at least one predetermined portion into said first and second semiconductor layers while using said oxide region as a mask for the impurity diffusion so as to form a first diffused region of said first conductivity type having a relatively high impurity concentration and defining a second PN junction with said first semiconductor layer, said second PN junction terminating at said first PN junction at a location spaced from the side surface of said oxide region; and
   h. providing an electrode in contact with said first diffused region extending over said oxide beak.

2. The method of claim 1, wherein after step (g) and before step (h) an impurity of said second conductivity type is selectively diffused into said first diffused region so as to form a second diffused region of said second conductivity type.

3. A method for manufacturing a semiconductor device including a silicon transistor comprising the succeeding steps of:
   a. providing a silicon substrate of a first conductivity type including at a surface thereof a silicon region of a second conductivity type opposite said first conductivity type;
   b. forming a first silicon layer for defining a collector region of said second conductivity type on said silicon substrate so as to bury said silicon region thereunder;
   c. forming a second silicon layer of said first conductivity type and having relatively low impurity concentration over the entire surface of said first silicon layer whereby a first PN junction is formed;
   d. selectively forming a silicon nitride film so as to cover at least one predetermined portion of said second silicon layer;
   e. selectively oxidizing said first and second silicon layers except for said at least one predetermined portion so that a silicon oxide region having an oxide beak extending between the edge of said silicon nitride film and the portion of said second silicon layer thereunder is formed, whereby said first PN junction terminates at the side surface of said silicon oxide region;
f. removing said silicon nitride film thereby exposing the surface of said at least one predetermined portion of said second silicon layer;
g. forming the base region of said transistor by diffusing an impurity of said first conductivity type through said at least one predetermined portion into said second silicon layer while using the silicon oxide region as a mark for said impurity diffusion so as to form a first diffused region of said second conductivity type having a relatively high impurity concentration, diffusion of said first impurity being carried out so that the termination of said first PN junction is maintained at the side surface of said silicon oxide region, whereby the portion of said PN junction terminating at the side surface of said silicon oxide region partially defines the base-collector PN junction of said transistor;
h. forming the emitter region of said transistor by selectively diffusing an impurity of said second conductivity type into said base region so as to form a second diffused region; and
i. providing electrodes in contact respectively with said first and second diffused regions, at least one of said electrodes extending over said oxide beak.

* * * * *